United States Patent [19]
Izume et al.

[11] Patent Number: 5,307,558
[45] Date of Patent: May 3, 1994

[54] PARTS MOUNTING APPARATUS

[75] Inventors: Takatomo Izume, Urawa; Koji Taira, Fuchu; Hiroshi Hohrai, Kuwana; Etuo Minamihama, Yokkaichi; Yasuharu Ujiie; Hisao Suzuki, both of Tokyo, all of Japan

[73] Assignees: Kabushiki Kaisha Toshiba; Japana Tobacco Inc., both of Kanagawa, Japan

[21] Appl. No.: 949,437

[22] Filed: Sep. 23, 1992

[30] Foreign Application Priority Data

Sep. 25, 1991 [JP] Japan .................. 3-245909

[51] Int. Cl.⁵ ................. B23P 21/00; B23P 19/04
[52] U.S. Cl. ........................... 29/712; 29/739; 29/743; 29/DIG. 44
[58] Field of Search ............. 29/739, 740, 741, 743, 29/832, 834, 836, 709, 711, 712; 198/377, 475.1, 476.1; 414/223, 225, 737, 744.2

[56] References Cited

U.S. PATENT DOCUMENTS

| | | | |
|---|---|---|---|
| 4,793,707 | 12/1988 | Hata et al. | 29/721 X |
| 4,951,383 | 8/1990 | Amao et al. | 29/740 X |
| 5,033,185 | 7/1991 | Hidese | 29/743 X |
| 5,060,366 | 10/1991 | Asai et al. | 29/836 X |
| 5,234,304 | 8/1993 | Okumoto et al. | 414/225 |

FOREIGN PATENT DOCUMENTS

| | | | |
|---|---|---|---|
| 2451549 | 8/1976 | Fed. Rep. of Germany | 29/743 |
| 205500 | 8/1989 | Japan | 29/743 |
| 362598 | 3/1991 | Japan | 29/743 |

*Primary Examiner*—Peter Dungba Vo
*Attorney, Agent, or Firm*—Limbach & Limbach

[57] ABSTRACT

In a parts mounting apparatus, suction nozzles are mounted on a rotating carrier driven by a motor. With rotation of the rotating carrier, parts are sucked by the nozzles at a feed station and carried to a mounting station where the parts such as electronic parts are mounted on substrates, for example. A counter counts output pulses from an encoder mounted in the motor driving the rotating carrier. A microcomputer determines the rotational speed and rotational position of the rotating carrier from the count value of the counter. Based on the result of the determination, the microcomputer calculates a timing for delivering a signal for switching the nozzles between two different pneumatic states.

6 Claims, 4 Drawing Sheets

PARTS MOUNTING APPARATUS

BACKGROUND OF THE INVENTION

1. Field of the Invention

This invention relates to a parts mounting apparatus wherein electronic or other parts are mounted on other parts or members such as circuit substrates by mounting heads provided on a rotating carrier, and more particularly, to such a parts mounting apparatus wherein each of the mounting heads is provided with part sucking and mounting nozzles each switched between negative and positive pressure states for sucking the part and releasing and thereby mounting the same.

2. Description of the Prior Art

The assignees of the present application have jointly developed a parts mounting apparatus of the above-described type in which the parts mounting work can be performed at a high speed by continuous rotation of a rotating drum or carrier, and applied for patent on the invention on Mar. 26, 1991 in Japan. This Japanese application was published under the publication number of 3-274800. This developed apparatus comprises a rotating carrier driven by a motor, a feed station provided along a periphery of the rotating carrier for feeding parts to be mounted, a mounting station where other parts or members on which the parts fed at the feed station are to be mounted are disposed, and a plurality of mounting heads provided on the peripheral side of the rotating carrier and each having a plurality of suction nozzles sucking a part. Each mounting head alternately repeatedly performs picking up or sucking the parts at the feed station and placing or mounting them on the members at the mounting station with rotation of the rotating carrier. In this case, each mounting head performs a rotative movement about an axis extending radially with respect to the rotating carrier in synchronism with the same. This rotative movement of each mounting head is referred to as "cycloid movement." The above-mentioned sucking and mounting of the parts are performed at bottom dead points of the cycloid movement of each mounting head, at which points the mounting head is substantially stationary for about 4 milliseconds. That is, each of the sucking and the mounting of the parts needs to be performed in a short time period of about 4 milliseconds for which the mounting head is maintained at the bottom dead point of the cycloid movement.

Each suction nozzle is provided with a switching valve for switching the nozzle between positive and negative pressure states when the part is sucked and mounted. An encoder is provided for detecting a rotational position of the rotating carrier. A switching timing of each switching valve is based on outputs of the encoder.

An electromagnetic valve is used as the above-described switching valve. Several milliseconds or several ten milliseconds are required for a response time period of the switching valve which is a time period from the start of the switching to its completion. Accordingly, in the prior art, the switching of the valve is started based on the output of the encoder when the nozzle of the mounting head reaches a predetermined position before the bottom dead point, and the switching is completed when the nozzle reaches the bottom dead point.

If the above-described switching timing of the valve is shifted for some reason or other, the part is thrown out of the nozzle before or after it reaches the bottom dead point. Thus, the shift in the switching timing of the switching valve reduces accuracy in the mounting of the parts on the substrates. Experiments made by the inventors show that the shift of the mounting nozzle needs to be confined to a range of ±2 milliseconds.

However, the rotational speed of the rotating carrier of the above-described parts mounting apparatus slightly changes depending upon the size of the load. Furthermore, a case is considered where the rotational speed of the rotating carrier is positively adjusted. In such a case, when the switching valve is controlled based on the rotational position of the rotating carrier, the shift in the timings of sucking and the mounting of the parts sometimes exceeds the range of ±2 milliseconds.

SUMMARY OF THE INVENTION

Therefore, an object of the present invention is to provide a parts mounting apparatus wherein the parts mounting work can be performed at a high speed by the rotating carrier and the sucking and the mounting of the parts can be performed at highly precise timings.

The present invention provides a parts mounting apparatus comprising a rotating carrier, a feed station provided around the rotating carrier for feeding parts to be mounted, and a mounting station provided around the rotating carrier so as to be spaced from the feed station, the mounting station being fed with members on which the parts at the feed station are to be mounted. A mounting head is provided on the rotating carrier for performing a cycloid movement in synchronism with rotation of the rotating carrier, the cycloid movement having a plurality of bottom dead points. A suction nozzle is provided on the mounting head and is switched between first and second pressure states. The nozzle sucks the part at the feed station in the first pressure state when one of the bottom dead points of the cycloid movement of the mounting head is reached. The nozzle releases sucking of the part over the member at the mounting station in the second pressure state when the other or another one of the bottom dead points is reached, thereby mounting the part on the member at the mounting station. Valve means is provided for switching the nozzle between the first and second pressure states. Position detecting means is provided for detecting a rotational position of the rotating carrier. Speed detecting means is provided for detecting a rotational speed of the rotating carrier. Part sucking and mounting timing calculating means is provided for calculating timings of sucking and mounting of the part from data of results of detection by both of the position and the speed detecting means. Valve control means is provided for controlling the valve means for switching the valve means between the first and second pressure states prior to each of the part sucking and mounting timings calculated by the part sucking and mounting timing calculating means, based on the part sucking and mounting timings and a period of time required for the switching of the valve means.

The part is sucked and mounted on the member by the nozzle when the mounting head performing the cycloid movement reaches the respective bottom dead points. Accordingly, the times when the mounting head reaches the respective bottom dead points correspond to the timings for the sucking and the mounting of the part, that is, the timings for the nozzle to be changed between the first and second pressure states. In this case, several milliseconds or several ten milliseconds are generally required for the switching of the nozzle between the first and second pressure states Accordingly, the sucking and the mounting of the part can be performed without any shift in the timings when the switching of the valve means is initiated at the time obtained by subtracting the time period necessary for switching the valve means between the pressure states from the time when the mounting head reaches the predetermined bottom dead point.

The timings of the sucking and the mounting of the part are determined in consideration not only of the rotational position of the rotating carrier but also of its rotational speed. Consequently, highly precise timings can be obtained even in the occurrence of variations in the rotational speed of the carrier and the like.

The valve control means is designed to obtain the timings for switching the valve means from the timings for the sucking and the mounting of the part and the time period required for the switching of the valve means. Consequently, the nozzle can be switched between the pressure states in the accurate timings, which can provide high precision of the parts mounting work.

Other objects of the present invention will become obvious upon understanding of the illustrative embodiments about to be described. Various advantages not referred to herein will occur to one skilled in the art upon employment of the invention in practice.

BRIEF DESCRIPTION OF THE DRAWINGS

Embodiments of the present invention will be described with reference to the accompanying drawings in which.

DESCRIPTION OF THE PREFERRED EMBODIMENTS

Figure 1:
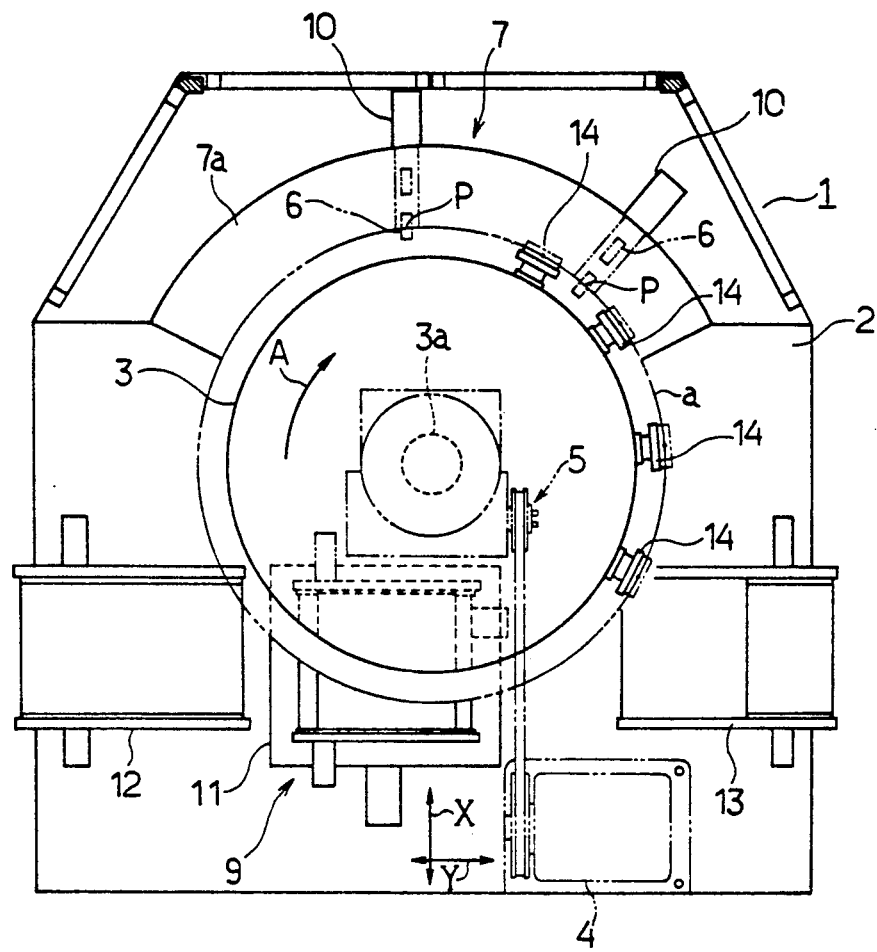
FIG. 1 is a plan view of the parts mounting apparatus of one embodiment in accordance with the present invention.

One embodiment in which electronic parts are mounted on circuit substrates by the parts mounting apparatus in accordance with the invention will be described with reference to FIGS. 1 to 7. First, the construction of the parts mounting apparatus will be described. Referring to FIG. 1 showing the side view of the apparatus body 1, a rotating drum or carrier 3 is mounted at the center of a base 2 for rotative movement about a vertical shaft 3a. The rotating carrier 3 is continuously rotated in the direction of arrow A via a conventional reduction mechanism 5 comprising belts and pulleys by a drive motor 4 mounted on the base 2.

A feed station 7 is provided on the base 2 for feeding electronic parts (chips) 6 and a mounting station 9 is also provided on the base 2. Circuit substrates 8 (see FIG. 2) as other parts or members are disposed in the mounting station 9. These stations 7, 9 are positioned around the rotating carrier 3. More specifically, the feed station 7 is positioned at the upper side of the rotating carrier 3 as viewed in FIG. 1. The feed station 7 has a feed table 7a which is circular along the outer periphery of the rotating carrier 3. A plurality of parts feeders 10 are mounted on the feed table 7a. Two of such parts feeders 10 are shown in FIG. 1. Each parts feeder 10 comprises a conventional tape feeder, for example. The parts feeders 10 feed one electronic part 6 to predetermined sucking points P on the feed table 7a, respectively. The sucking points P are arranged on a circumference a which is a locus of a mounting head moved on a plane, as will be described later. The circumference a is shown by a two-dot chain line in FIG. 1.

The mounting station 9 is positioned at the lower side of the rotating carrier 3 as viewed in FIG. 1. The substrates 8 are disposed on the mounting station 8 as described above and a movable table 11 is provided for moving the substrates 8 in the directions of X and Y axes on a plane in FIG. 1. The substrate 8 is moved by the movable table 11 in the directions of the X and Y axes so that a predetermined mounting point on the substrate 8 comes on a mounting point Q on the circumference a. The substrates 8 are fed onto and out of the movable table 11 by feed-in and feed out conveyors 12 and 13 provided at the left-hand and right-hand sides of the rotating carrier 3, respectively, as viewed in FIG. 1.

Figure 2:
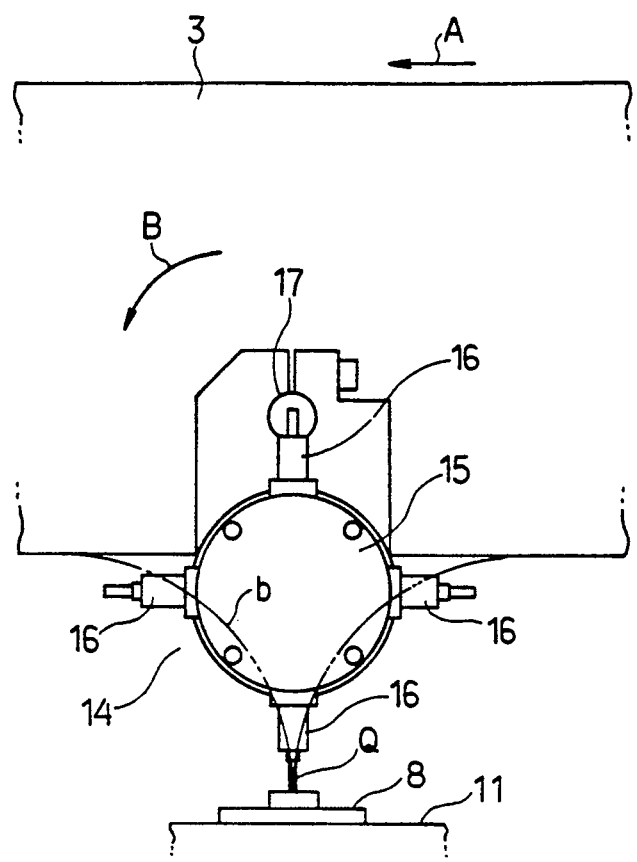
FIG. 2 is an enlarged side view of the mounting head employed in the apparatus in FIG. 1.

A plurality of mounting heads 14 are mounted on the circumferential face of the rotating carrier 3 so as to be circumferentially arranged at equal intervals. Twelve such mounting heads 14 are employed in the embodiment, for example, and four of them are shown in FIG. 1. As shown in FIG. 2 in detail, each mounting head 14 has four suction nozzles 16 having different sizes from one another. The nozzles 16 are mounted on a disc 15 at the intervals of 90 degrees. The disc 15 of each mounting head 14 is rotatively moved about a horizontal axis by 90 degrees so that one of the four nozzles 16, which size is in accordance with the kind of the part 6, is selected. The mounting of the part 6 is carried out by the selected nozzle 16, as will be described in detail later.

In the parts mounting work, the mounting head 14 is controlled by an attitude control mechanism (not shown) so as be maintained in the same attitude and is continuously rotated in the direction of an arrow B in FIG. 2 about a shaft extending radially of the rotating carrier 3 by a drive mechanism (not shown). The rotation of the mounting head 14 is synchronized with that of the rotating carrier 3 and the mounting head 14 is rotated ten turns while the rotating carrier 3 is rotated one turn, for example. Consequently, the distal end of the nozzle 16 of the mounting head 14 performs a cycloid movement having a plurality of bottom dead points, around the rotating carrier 3. The cycloid movement of the mounting head 14 has ten such bottom dead points in the embodiment. Two-dot chain line b in FIG. 2 shows a part of a locus of the distal end of the nozzle 16 on a vertical plane. As obvious from FIG. 2, the bottom dead point of the movement locus of the lower end of the nozzle 16 coincides with the above-mentioned sucking point P and mounting point Q.

The nozzle 16 is connected via an sucking valve 18 (see FIG. 3) comprising an electromagnetic valve to a negative pressure source comprising a vacuum pomp, for example and also, via a mounting valve 19 (see FIG. 3) comprising an electromagnetic valve to a positive pressure source comprising a compressor, for example. The sucking and mounting valves 18, 19 are opened and closed through respective drivers 21 and 22 by a microcomputer 20 (see FIG. 3), as will be described in detail later.

The nozzle 16 is led into a negative pressure state at one of the bottom dead points or sucking point P by the sucking valve 18, thereby sucking the part 6 at the feed station 7 and carrying it. Thereafter, the nozzle 16 carrying the part 6 is led into a positive pressure state at another bottom dead point or mounting point Q by the mounting valve 19, thereby releasing suction of the part 6 over the substrate 8 at the mounting station 9 and mounting it on the substrate 8 at the mounting point Q. This mounting work is continuously repeated.

A detection mechanism (not shown) comprising a camera is disposed at the right-hand side of the circumference of the rotating carrier 3 in FIG. 1. This detection mechanism is provided for determining whether or not the nozzle 16 is sucking the part 6 at a proper position or whether or not the nozzle 16 is sucking the central portion of the part 6. When the nozzle 16 is not sucking the part 6 properly, it is turned 45 degrees and the mounting of the part 6 is not carried out when the nozzle 16 reaches the mounting station 9. Thereafter, when the nozzle 16 passes the mounting station 9 and reaches a discharge point, it is turned to the positive pressure state. The sucked part 6 is removed from the nozzle 16 at the discharge point such that the mounting of the removed part 6 is interrupted. Since the detecting mechanism and the discharge mechanism are not directly related to the present invention, further description of each mechanism is eliminated.

Figure 3:
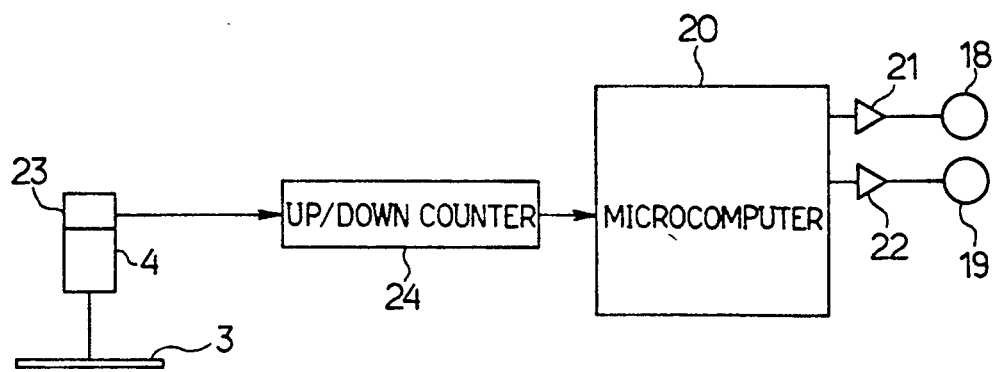
FIG. 3 is a schematic block diagram showing the encoder and its related portion.

The above-mentioned microcomputer 20 controls each mechanism of the apparatus and serves as valve control means for controlling the sucking and mounting valves 18, 19, as described above. An arrangement for the control of the valves 18, 19 is as follows. As shown in FIG. 3, a rotary encoder 23 is provided which has an input shaft coupled to the counter load side of the drive motor 4 driving the rotating carrier 3. This encoder 23 generates one reference pulse every one turn of the input shaft and one rotation pulse every predetermined angle of rotation of the input shaft. The rotation pulses generated by the encoder 23 are divided into two phases A and B having the phase difference of 90 degrees from each other. The microcomputer 20 is designed to obtain the origin of the rotating carrier 3 from the reference pulses generated by the encoder 23 and signals generated by a microswitch (not shown) mounted on the rotating carrier 3. The microcomputer 20 performs an operation for return to origin at the time of power supply to the apparatus so that a mechanical origin and an electrical origin are caused to coincide with each other.

Figure 4:
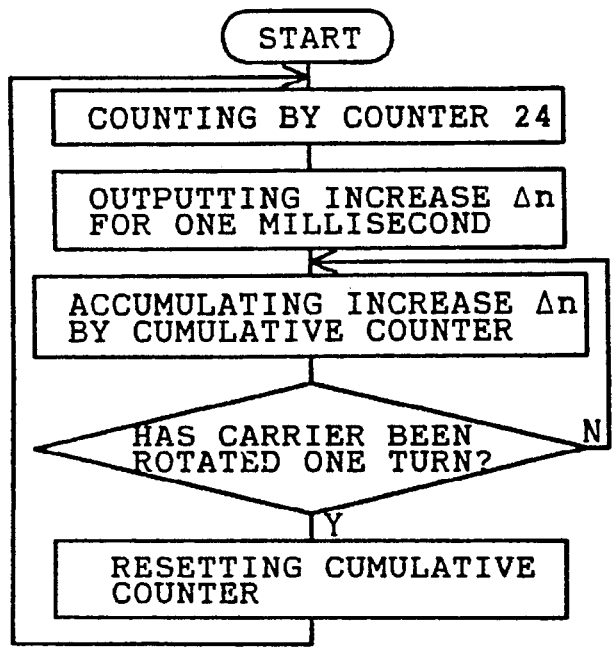
FIG. 4 is a flowchart for explaining the operation of the speed detecting means.
Figure 5:
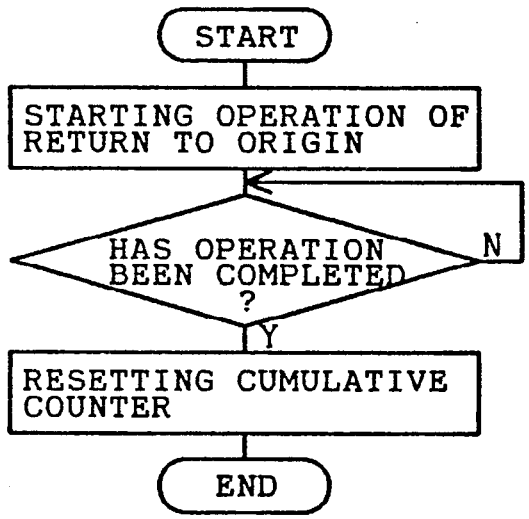
FIG. 5 is a flowchart for explaining the control contents for the return to origin.

FIG. 4 shows the operation of the microcomputer 20 as the position detecting means. The rotation pulses from the encoder 23 are input to a 16-bit up/down counter 24, for example. The counter 24 has a phase-discriminating function that it receives the rotation pulses at its up-count input side in the case of forward rotation (direction of arrow A) of the rotating carrier 3 and receives the rotation pulses at a down-count input side in the case of reverse rotation of the rotation carrier 3. The microcomputer 20 is provided with a cumulative counter and reads the counted value of the counter 24 at intervals of one millisecond. The current counted value is compared with the last value read before one millisecond so that an increase $\Delta n$ is obtained. The increase $\Delta n$ is added to the cumulative counter. The microcomputer 20 subtracts a predetermined value corresponding to one turn of the carrier 3 from the accumulated value of the cumulative counter, every time the carrier 3 completes one turn. Consequently, the value of the cumulative counter corresponds to the rotational position of the carrier 3 for detection thereof. The cumulative counter is reset to zero at the time of the above-described return-to-origin operation.

Figure 6:
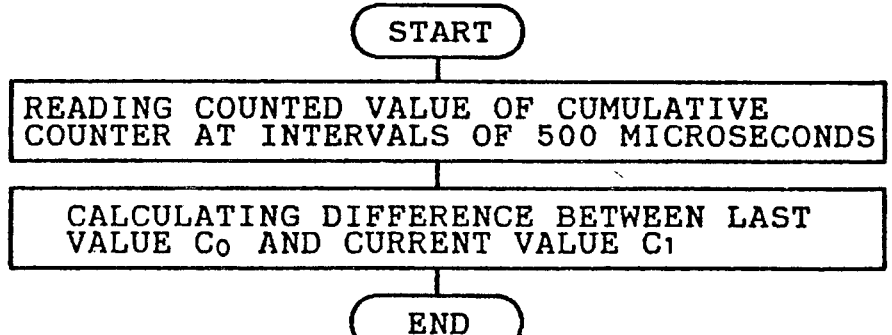
FIG. 6 is a flowchart for explaining the procedure of rotational speed detection.

FIG. 6 shows the operation of the microcomputer 20 as speed detecting means. As shown, the microcomputer 20 reads the value of the cumulative counter at predetermined intervals, for example at the intervals of 500 milliseconds and obtains the difference between the currently read value $C_1$ and the last read value $C_0$, thereby detecting the current rotational speed of the carrier 3.

Based on the detected rotational position and rotational speed of the carrier 3, the microcomputer 20 calculates the timings of each nozzle 16 to reach the respective suction point P and mounting point Q or suction and mounting timings. Thus, the microcomputer 20 serves as suction and mounting timing detecting means.

Furthermore, the microcomputer 20 has a memory for storing data of previously measured time periods necessary for the switching of the sucking and mounting valves 18, 19 between the closed and open states. In this regard, it takes several to several ten milliseconds (20 milliseconds, for example) from the start of the switching to its completion. The microcomputer 20 obtains a switching timing from the sucking and mounting timings and the time periods required for the switching of the valves, as will become obvious from the following description of the operation. Based on the obtained switching timings, the microcomputer 20 controls the sucking and mounting valves 18, 19.

The operation of the parts mounting apparatus will be described. When the apparatus is connected to an electric power source, the operation of return to origin is performed as described above and thereafter, an automatic operation is initiated. In the automatic operation, the drive motor 4 is energized to drive the rotating carrier 3 and the rotation pulses are generated by the encoder 23. The counter 24 is operated in response to the rotation pulses. Now, let the number of pulses generated by the encoder 23 be 2000 pulses/revolution, leading edge and trailing edge signals of each pulse in phases A and B be counted and the reduction ratio of the reduction mechanism 5 be $\frac{1}{80}$, the number $P_0$ of pulses generated by the encoder 23 during one turn of the carrier 3 can be obtained as follows:

$$P_0 = 2000 \times 4 \times 80 = 640000 \text{ pulses.}$$

When twelve mounting heads 14 are mounted on the carrier 3,

640000/12 ≅ 53333 pulses.

Since each nozzle 16 performs the mounting work at the intervals of 53,333 pulses, the control of the sucking and mounting valves 18, 19 is performed every time the value of the cumulative counter exceeds $N \times 53,333$ pulses where $N = 1, 2, \ldots 11$. When the 100% rated rotational speed of the carrier 3 is 40 r.p.m., 60/40/12 = 0.125 sec.

Accordingly, the control of the valves 18, 19 is performed at the intervals of 125 milliseconds.

The microcomputer 20 reads the value of the cumulative counter at the intervals of 500 milliseconds to obtain the rotational speed of the carrier 3. When the value of the cumulative counter is 50,000 pulses/500 milliseconds, the rotational speed R of the carrier 3 can be calculated as follows:

$$R = 50000 \times 60/0.5/640000 = 9.375 \text{ r.p.m.}$$

The sucking and the mounting of the part 6 are performed by the nozzle 16 when the mounting head 14 reaches the respective bottom dead points of the cycloid movement, at which points the mounting head 14 is substantially stationary for about four milliseconds. Since it takes several to several ten milliseconds from the start of the switching to its completion, the switching of the valves needs to be initiated prior to the times when the nozzle 16 reaches the sucking and mounting points P, Q or the sucking and mounting timings by the time period necessary for the switching of the valves. When the time period necessary for the switching of the valves 18, 19 is 20 milliseconds, the control of the sucking and mounting valves 18, 19 is performed at the intervals of 125 milliseconds when the carrier 3 is in rotation at 100% rated rotational speed. Accordingly, the switching of the valves 18, 19 needs to be initiated 20 milliseconds before the sucking and mounting timings. Thus, the switching timings of the valves 18, 19 can be obtained as follows:

$1 \times 125 - 20 = 105$ milliseconds
$2 \times 125 - 20 = 230$ milliseconds
$3 \times 125 - 20 = 355$ milliseconds
...
$12 \times 125 - 20 = 1480$ milliseconds.

Converted into the values of the cumulative counter, the above-described values are as follows:

$$1 \times 53333 - 53333 \times 20/125 = 44800 \text{ pulses}$$

$$2 \times 53333 - 53333 \times 20/125 = 105301 \text{ pulses}$$

$$3 \times 53333 - 53333 \times 20/125 = 151466 \text{ pulses}$$

...

$$12 \times 53333 - 53333 \times 20/125 = 631463 \text{ pulses.}$$

The microcomputer 20 monitors the value of the cumulative counter at the intervals of one millisecond. When the value of the cumulative counter is equal to or exceeds any one of the above-described values, the switching of the valves 18, 19 is started. Consequently, the valves 18, 19 can be controlled with tolerances to 1 millisecond.

Figure 7:
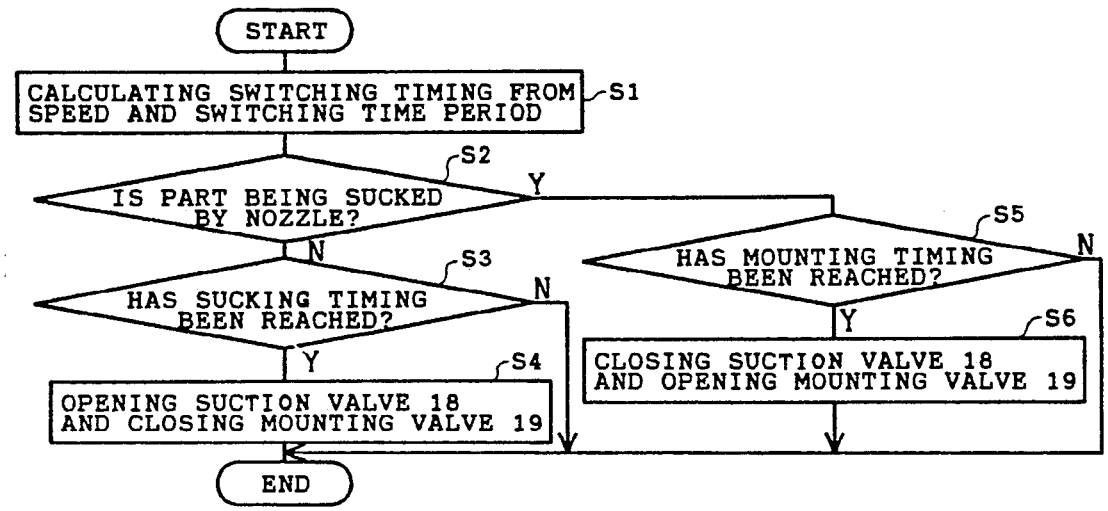
FIG. 7 is a flowchart for explaining the procedures for controlling the parts sucking and mounting nozzle.

FIG. 7 shows a manner of the above-described control. First, the switching timings are calculated as described above at step S1. The sucking valve 18 is opened and the mounting valve 19 is closed at step S4 when the sucking timing is reached at step S3. The sucking valve 18 is closed and the mounting valve 19 is opened at step S6 when the mounting timing is reached at step S5. When the rotational speed of the carrier 3 is b 40 r.p.m.(100% rated rotational speed), the value C of the cumulative counter is shown generally by the following expression:

$$C = 100 \times 53333/R \times (1 - T_0/125)$$

where $T_0$ is a time period necessary for the switching of the valves 18, 19 and R is the current rotational speed (100% rated rotational speed) of the carrier 3.

In accordance with the above-described embodiment, the detection of the timings for sucking and mounting the parts is based on the rotational position and the rotational speed of the carrier 3 while in the prior art, the switching valves are controlled based only on the rotational position of the carrier. Consequently, precise sucking and mounting timings can be detected in accordance with the current rotational speed of the carrier even when the rotational speed of the carrier 3 varies.

The microcomputer 20 obtains the switching timing from both the detected sucking and mounting timings and the time period necessary for the switching of the valves 18, 19. Consequently, the nozzle 16 can be switched between the positive and negative pressure states at a precise timing and accordingly, the parts mounting work can be performed with the tolerances to ±1 millisecond.

Figure 8:
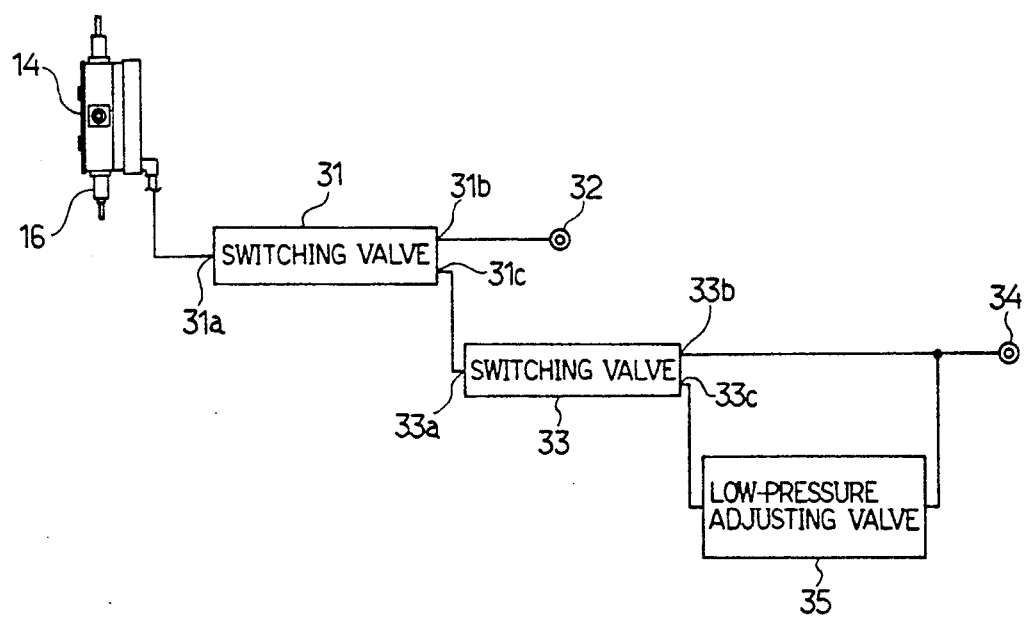
FIG. 8 is a block diagram showing the principal part of the parts mounting apparatus of another embodiment.

FIG. 8 illustrates another embodiment of the present invention. This embodiment differs from the foregoing one in the construction of the valve for changing the valve between the positive and negative pressure states. The difference between the embodiments will be described. The sucking and mounting nozzle 16 is connected to a flow passage 31a of a first switching valve 31. The first switching valve 31 is switched such that the flow passage 31a is connected selectively to either one of flow passages 31b and 31c. The flow passage 31b is connected to a negative pressure source 32 and the flow passage 31c is connected to a flow passage of 33a of a second switching valve 33. The second switching valve 33 is switched such that the flow passage 33a of the second switching valve 33 is connected selectively to either one of flow passages 33b and 33c. The flow passage 33b is connected to a positive pressure source 34 and the flow passage 33c is connected via a low-pressure adjusting valve 35 to the positive pressure source 34. Thus, the nozzle 16 can be switched among three states, that is, the negative pressure, low positive pressure and high positive pressure states. In this case, the nozzle 16 is led to the negative pressure state when the part 6 is sucked at the feed station and carried to the mounting station. However, when releasing the suction to mount the part 6, the nozzle 16 is led to the low positive pressure state wherein the pressure is adjusted by the low-pressure adjusting valve 35.

These first and second switching valves 31, 33 are controlled by the microcomputer 20. The second switching valve 33 is usually held in the low positive pressure state and only the first switching valve 31 is switched in the above described timings so that the mounting work is performed.

In the case where the parts 6 are relatively small-sized and light-weighted, for example, there is a possibility that the parts 6 may be blown off by the pressure and may not be mounted at a proper position when the positive pressure applied to the nozzle 16 is so much increased at the time of the mounting of the part 6 on the substrate. However, the low-pressure adjusting valve 35 is provided so that the positive pressure applied to the nozzle 16 is adjusted in accordance with the size and weight of the part 6.

When the part 6 is not properly sucked by the nozzle 16 as the result of detection by the detection mechanism as described in the first embodiment and it is to be removed from the nozzle 16, the first switching valve 31 is switched to the positive pressure state and the second switching valve 33 is switched to the high pressure state so that the nozzle 16 is led to the high positive pressure state. The above-described arrangement achieves the same effect as in the previous embodiment. Additionally, the above-described arrangement provides a stable mounting work in which the variations of the size and weight of the part 6 are eliminated. Furthermore, the part 6 can be reliably removed from the nozzle 16 when it is improperly sucked by the nozzle 16.

The foregoing disclosure and drawings are merely illustrative of the principles of the present invention and are not to be interpreted in a limiting sense. The only limitation is to be determined from the scope of the appended claims.

We claim:

1. A parts mounting apparatus comprising:
   a) a rotating carrier;
   b) a feed station provided around the rotating carrier for feeding parts to be mounted;
   c) a mounting station provided around the rotating carrier so as to be spaced from the feed station, the mounting station being fed with members on which the parts at the fed station are to be mounted;
   d) a mounting head provided on the rotating carrier for performing a cycloid movement in synchronism with rotation of the rotating carrier, the cycloid movement having a plurality of bottom dead points;
   e) a suction nozzle provided on the mounting head, the nozzle being switched between first and second pressure states, the nozzle sucking the part at the feed station in the first pressure state when one of the bottom dead points of the cycloid movement of the mounting head is reached, the nozzle releasing sucking of the part over the member at the mounting station in the second pressure state when the other or another one of the bottom dead points is reached, thereby mounting the part on the member at the mounting station;
   f) valve means for switching the nozzle between the first and second pressure states;
   g) position detecting means for detecting a rotational position of the rotating carrier;
   h) speed detecting means for detecting a rotational speed of the rotating carrier;
   i) part sucking and mounting timing calculating means for calculating timings of sucking and mounting of the part from data of results of detection by both of the position and the speed detecting means; and
   j) valve control means for controlling the valve means for switching the valve means between the first and second pressure sates prior to each of the part sucking and mounting timings calculated by the part sucking and mounting timing calculating means, based on the part sucking and mounting timings and a period of time required for the switching of the valve means.

2. The parts mounting apparatus of claim 1, wherein the first pressure state of the nozzle switched by the valve means is a negative pressure state and the second pressure state of the nozzle switched by the valve means is a positive pressure state.

3. The parts mounting apparatus of claim 2, wherein the valve means includes adjusting valve means for adjusting the positive pressure state in accordance with size and weight of the parts.

4. The parts mounting apparatus of claim 1, wherein the valve control means stores data of previously measured time periods necessary for the switching of the valve means.

5. The parts mounting apparatus of claim 1, wherein the position detecting means includes:
   pulse generating means for generating one rotation pulse every predetermined angle of rotation of the rotating carrier;
   a counter capable of receiving the rotation pulses at an up-count input side thereof in forward rotation of the rotating carrier and receiving the rotation pulses at a down-count input side thereof in the case of reverse rotation of the rotating carrier; and
   position calculating means for calculating a rotational position of the rotating carrier based on the counted value of the counter.

6. The parts mounting apparatus of claim 1, wherein the speed detecting mans includes:
   pulse generating means for generating one rotation pulse every predetermined angle of rotation of the rotating carrier;
   a counter capable of receiving the rotation pulses at an up-count input side thereof in forward rotation of the rotating carrier and receiving the rotation pulses at a down-count input side thereof in the case of reverse rotation of the rotating carrier; and
   speed calculating means for calculating a rotational speed of the rotating carrier based on the counted value of the counter.

* * * * *